United States Patent [19]
Phillips, Jr. et al.

[11] Patent Number: 5,650,877
[45] Date of Patent: Jul. 22, 1997

[54] IMAGING SYSTEM FOR DEEP ULTRAVIOLET LITHOGRAPHY

[75] Inventors: Anthony R. Phillips, Jr., Fairport; Paul F. Michaloski, Rochester, both of N.Y.

[73] Assignee: Tropel Corporation, Fairport, N.Y.

[21] Appl. No.: 514,614

[22] Filed: Aug. 14, 1995

[51] Int. Cl.[6] .................................................. G02B 17/00
[52] U.S. Cl. ........................................ 359/732; 359/731
[58] Field of Search ................................. 359/732, 731, 359/730, 727, 726

[56] References Cited

U.S. PATENT DOCUMENTS

| | | |
|---|---|---|
| 4,953,960 | 9/1990 | Williamson . |
| 5,031,976 | 7/1991 | Shafer . |
| 5,031,977 | 7/1991 | Gibson ................................. 359/732 |
| 5,206,515 | 4/1993 | Elliott et al. . |
| 5,212,593 | 5/1993 | Williamson et al. . |
| 5,220,454 | 6/1993 | Ichihara et al. . |
| 5,241,423 | 8/1993 | Chiu et al. . |
| 5,251,070 | 10/1993 | Hashimoto et al. . |
| 5,289,312 | 2/1994 | Hashimoto et al. . |
| 5,402,267 | 3/1995 | Fürter et al. ........................... 359/732 |
| 5,461,456 | 10/1995 | Michaloski . |

FOREIGN PATENT DOCUMENTS 4203464  8/1992  Germany .

OTHER PUBLICATIONS

"A New Series of Microscope Objectives: I. Catadioptric Newtonian Systems" by David S. Grey and Paul H. Lee, Journal of the Optical Society of America, vol. 39, No. 9, Sep. 1949, pp. 719–728.

*Primary Examiner*—Scott J. Sugarman
*Attorney, Agent, or Firm*—Eugene Stephens & Associates

[57] ABSTRACT

A catadioptric reduction system operating in the deep ultraviolet range projects a reduced image of a mask on a substrate. A reducing optic made of a material transmissive to deep ultraviolet light has a concave front face covered by a partially reflective surface and a convex back face covered by a concave reflective surface surrounding a central aperture. The partially reflective surface transmits a portion of the light passing through the mask to the concave reflecting surface, which returns a portion of the transmitted light to the partially reflective surface. A portion of the returned light is reflected by the partially reflective surface on a converging path through said central aperture for producing a reduced image of the mask on the substrate.

30 Claims, 2 Drawing Sheets

IMAGING SYSTEM FOR DEEP ULTRAVIOLET LITHOGRAPHY

TECHNICAL FIELD

The invention relates to catadioptric reduction systems for projecting images with low aberrations and to exposure systems for microlithographic manufacture with deep ultraviolet light.

BACKGROUND

Microelectronics, including semiconductors, storage devices, and flat panel displays, are generally fabricated in successive layers using photolithographic techniques for patterning surface features. A reticle or mask having a predetermined pattern is evenly illuminated and projected onto a layer of photoresist on the surface of the microelectronic substrate. Exposed portions of the photoresist are chemically altered, rendering them more or less soluble to a developer that removes the soluble portions leaving a positive or negative image of the mask.

High resolution of the surface features is, of course, important; and improved resolution is continually sought for making the surface features smaller and more closely spaced so the resulting electronics can be made smaller, faster, and cheaper. A resolution dimension "R" representing minimum feature size is related to light wavelength "$\lambda$", numerical aperture "NA", and a process related constant "$K_1$" as follows:

$$R = K_1 \frac{\lambda}{NA}$$

Feature size "R" can be reduced by reducing the wavelength "$\lambda$" or the process constant "$K_1$" or by increasing the numerical aperture "NA". In production environments, process constants "$K_1$" equal to 0.7 to 0.8 are typical, whereas constants "$K_1$" as low as 0.5 can be achieved in laboratory settings. Numerical aperture "NA" and wavelength "$\lambda$" are also related to depth of focus "Df" as follows:

$$Df = \frac{\lambda}{NA^2}$$

A depth of focus "Df" of at least a fraction micron (e.g., 0.5 microns) is needed to accommodate flatness variations of the microelectronic substrates and their successive layers. Since numerical aperture "NA" is raised to a higher power than wavelength "$\lambda$" in the above expression for depth of focus "Df", resolution improvements achievable by enlarging numerical aperture "NA" are much more limited than those achievable by shortening the wavelength "$\lambda$".

Wavelengths less than 300 nanometers (NM) can be practically transmitted by only a few optical materials such as fused (synthetic) quartz and fluorite (calcium fluoride). The transmissivity of even these materials deteriorates at wavelengths in the deep ultraviolet range less than 200 NM so a minimum number of optical elements is desirable.

Although it is advantageous to minimize feature size of the images projected onto the microelectronic substrates, the feature size of the masks should remain large enough to manufacture efficiently and to avoid errors from mild levels of contamination. For example, it is important that small specks of contamination do not bridge features of the masks. Mask size can be maintained by optically reducing the projected image of the mask with respect to the mask itself.

Laser light sources operating within the ultraviolet and deep ultraviolet ranges emit light within narrow bands of wavelengths. However, even narrow bands of wavelength cause significant chromatic aberrations in single-material lenses with finite focal lengths. On the other hand, limiting laser output to a single wavelength is inefficient. Accordingly, catadioptric imaging systems have evolved which use reflective optics (mirrors) to reduce image size in combination with refractive optics (lenses) to compensate for symmetrical aberrations of the reflective optics.

Beamsplitters or partially reflective mirrors are used to separate light traveling to and from the reflective optics. Beamsplitters and partially reflective mirrors, particularly when subjected to angularly diverging beams, introduce additional aberrations requiring correction. The beamsplitters also add to the complexity of the imaging systems by misaligning the object and image planes.

A typical catadioptric optical reduction system used for microlithographic projections is disclosed in U.S. Pat. No. 5,241,423 to Chiu et al. A concave spherical mirror provides a four to five times reduction in the projected image size with respect to a mask, and a beam-splitting cube separates light beams traveling to and from the mirror. Groups of refractive optical elements located on opposite sides of the beam-splitting cube toward both the reticle (mask) and the substrate correct for aberrations of the mirror and beam-splitting cube.

Chiu et al.'s reduction system is intended for operation at wavelengths of about 248 NM produced by a KrF excimer laser. However, the large number of refractive elements and the bulky two prism construction of the beam-splitting cube limit usefulness of this system at shorter wavelengths. The transmission of light through fused quartz or fluorite diminishes with shortening wavelengths, so the number and bulk of refractive optics must be limited to utilize wavelengths within the deep ultraviolet spectrum at less than 200 NM length.

U.S. Pat. Nos. 5,251,070 and 5,289,312 to Hashimoto et al. also use a concave mirror to provide most of the reducing power but use a semi-transparent mirror on a plane parallel plate instead of a beam-splitting cube to separate light beams traveling to and from a concave mirror. The former patent of Hashimoto et al. incorporates plane parallel refracting plates to correct aberrations caused by the semi-transparent mirror. The latter patent of Hashimoto et al. uses high-power refractive optics to collimate the beam transmitted through the semi-transparent mirror. This reduces aberrations from the semi-transparent mirror but still requires other refractive optics to counteract aberrations introduced by the high-power refractive optics.

SUMMARY OF INVENTION

Our invention extends microlithographic manufacture into the deep ultraviolet spectrum (e.g., less than 200 NM wavelength) for further reducing the minimum feature size of projected images to less than 0.2 microns. A practical size reticle (mask) is maintained by achieving the feature size with a highly reduced image of the reticle. The number of corrective refractive optics is held to a minimum, and the configuration of optical elements is simplified by maintaining object and image planes of a reducing system both parallel to each other and aligned with a common optical axis.

A lens group conditions a beam of light after passing through the reticle. A reducing optic having specially configured front and back faces projects a reduced image of the reticle onto a substrate. Both the lens group and the reducing optic are made from materials that transmit deep ultraviolet light. The back face of the reducing optic has a central aperture surrounded by a concave reflective surface. The front face of the reducing optic has a partially reflective surface that transmits a portion of the light beam toward the concave reflecting surface and reflects a portion of the remaining light beam returned by the concave reflective surface on a converging path through the central aperture. The substrate is aligned with the aperture for receiving the reduced image of the reticle.

The reflective surfaces of the reducing optic provide the reducing power, which is preferably a 10-fold reduction in the mask size. The refractive elements of the lens group and reducing optic exhibit little or no combined reducing power to avoid chromatic aberrations. Instead, the lens group corrects at least some of the nonchromatic aberrations generated by the reducing optic. A substantially plane parallel plate is preferably incorporated into the lens group and modified to include an aspheric surface to correct spherical aberrations. The concave reflective surface of the reducing optic can also be modified to include an aspheric surface to correct spherical aberrations at an even higher rate.

A central obscuration blocks a portion of the beam of light, which would not be reflected by the concave reflective surface, from passing through the central aperture. Preferably, the central obscuration is limited in size to block no more than 15 percent of projected image. The central obscuration can be conveniently the beam diameter within the lens group. More than 15 percent blockage can cause significant degradation in contrast of the formed as a stop on the plane parallel plate.

DRAWINGS

DETAILED DESCRIPTION

Figure 1:
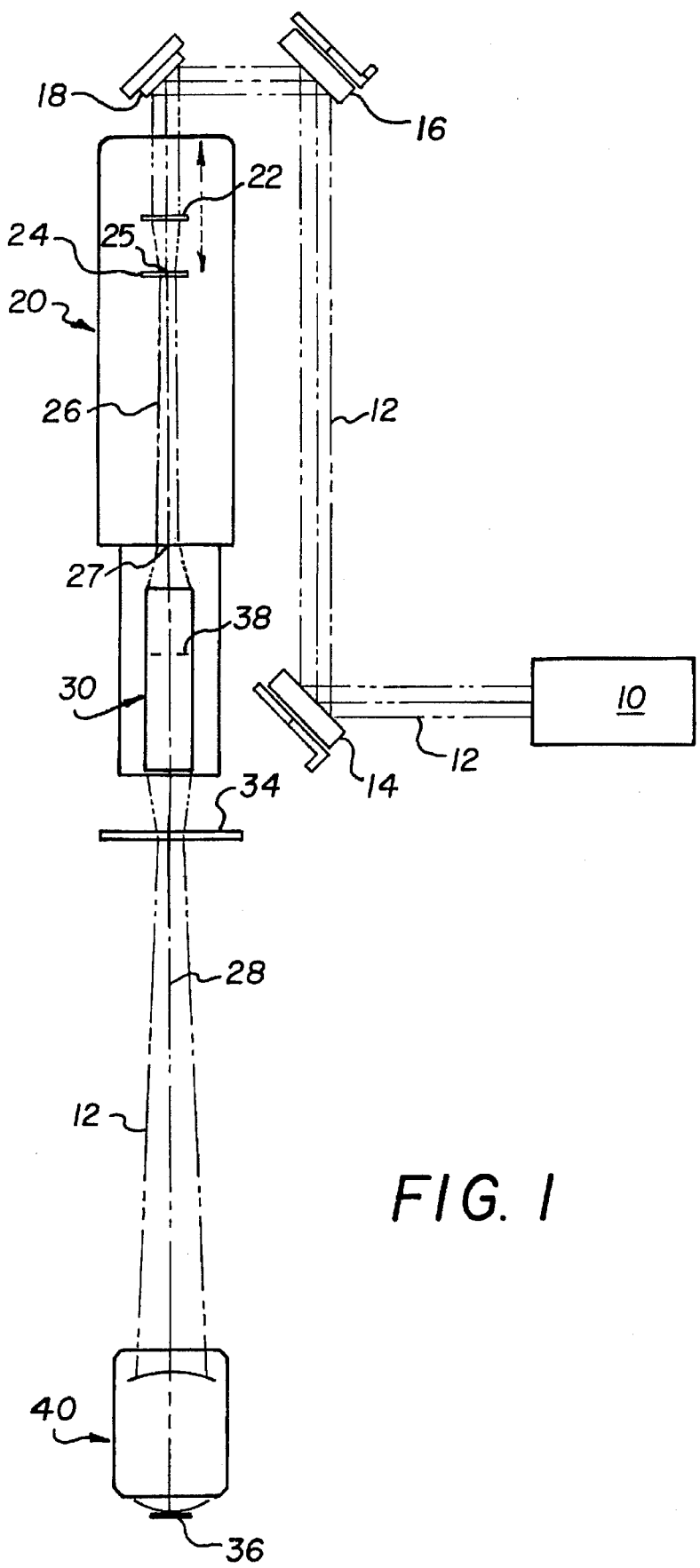
FIG. 1 is a schematic layout of a microlithographic projection system arranged according to our invention.

According to a preferred embodiment of our invention illustrated in the drawing figures, a laser light source 10 is an Argon-Fluoride excimer laser that produces a collimated beam 12 of ultraviolet light having a wavelength bandwidth between 192.6 and 194 NM. A series of three folding mirrors 14, 16, and 18 convey the collimated beam 12 to an illuminator 20.

Within the illuminator 20, the collimated beam 12 is attenuated and dispersed by a pair of diffusers 22 and 24 before entering a square reflecting tunnel 26. The diffuser 22 is adjustable along an optical axis 28 both to control the amount of light entering the reflecting tunnel 26 through the diffuser 24 and to more uniformly disperse the entering light over an area of the diffuser 24 in common with an entrance 25 of the reflecting tunnel 26. The amount of separation between the diffuser 22 and the tunnel entrance 25 controls the amount of excess light that is scattered beyond the tunnel entrance 25. Together, the two diffusers 22 and 24 produce a wider angle of uniformly dispersed light entering the reflecting tunnel 26.

The reflecting tunnel 26 functions as a "uniformizer" by dividing the diffused beam 12 into segments and arranging the segments into a contiguous array. Unlike most uniformizers, which are made from solid optical materials such as polyhedral rods or fly's eye lenses, the reflecting tunnel 26 is hollow with reflective sides to avoid excessive absorption of the deep ultraviolet light. Such excessive absorption limits control over the amount of light that can be transmitted through the illuminator 20 and reduces the useful life of the illuminator 20 by degrading the optical materials.

A lens group 30 magnifies and projects an image of a plane at an exit 27 of the reflecting tunnel 26 onto a plane of a reticle 34, which functions as a mask for microlithographic manufacture of a substrate 36. In addition, the lens group 30 images a plane at the entrance 25 of the reflecting tunnel 26 onto a plane at a variable aperture stop 38 within the lens group 30. The tunnel entrance 25 is imaged at the variable aperture stop 38 as an array of closely knit reflections produced by the reflecting tunnel 26. The variable aperture stop 38 functions as a mask by excluding portions of the beam 12 to enhance the diffractive effects of the reticle 34. For example, the aperture stop 38 can take the form of an annular ring or a series of holes which transmit only selected portions of the beam 12.

The combined effect of the diffusers 22 and 24, which provide a wider angular dispersion of light entering the reflecting tunnel 26, improves spatial uniformity of the distribution of light energy throughout the array of reflections within the aperture stop 38. The dispersion of light produced by the adjustable diffuser 22 on the diffuser 24 also improves the spatial uniformity of the distribution of light within each reflection of the tunnel entrance 25 that comprises the array. The improved spatial uniformity of the beam 12 at the aperture stop 38 enhances the masking effect of the aperture stop 38.

Although the uniformizing effects of the diffusers 22 and 24 are most evident at the aperture stop 38, spatial uniformity is also improved at the tunnel exit 27, which is imaged at the reticle 34. Thus, the light beam 12 impinges on the reticle 34 with a uniform spatial distribution of light energy, while the angular distribution of the impinging light is controlled by the aperture stop 38 to enhance the contrast of the reticle's image on the substrate 36.

Figure 2:
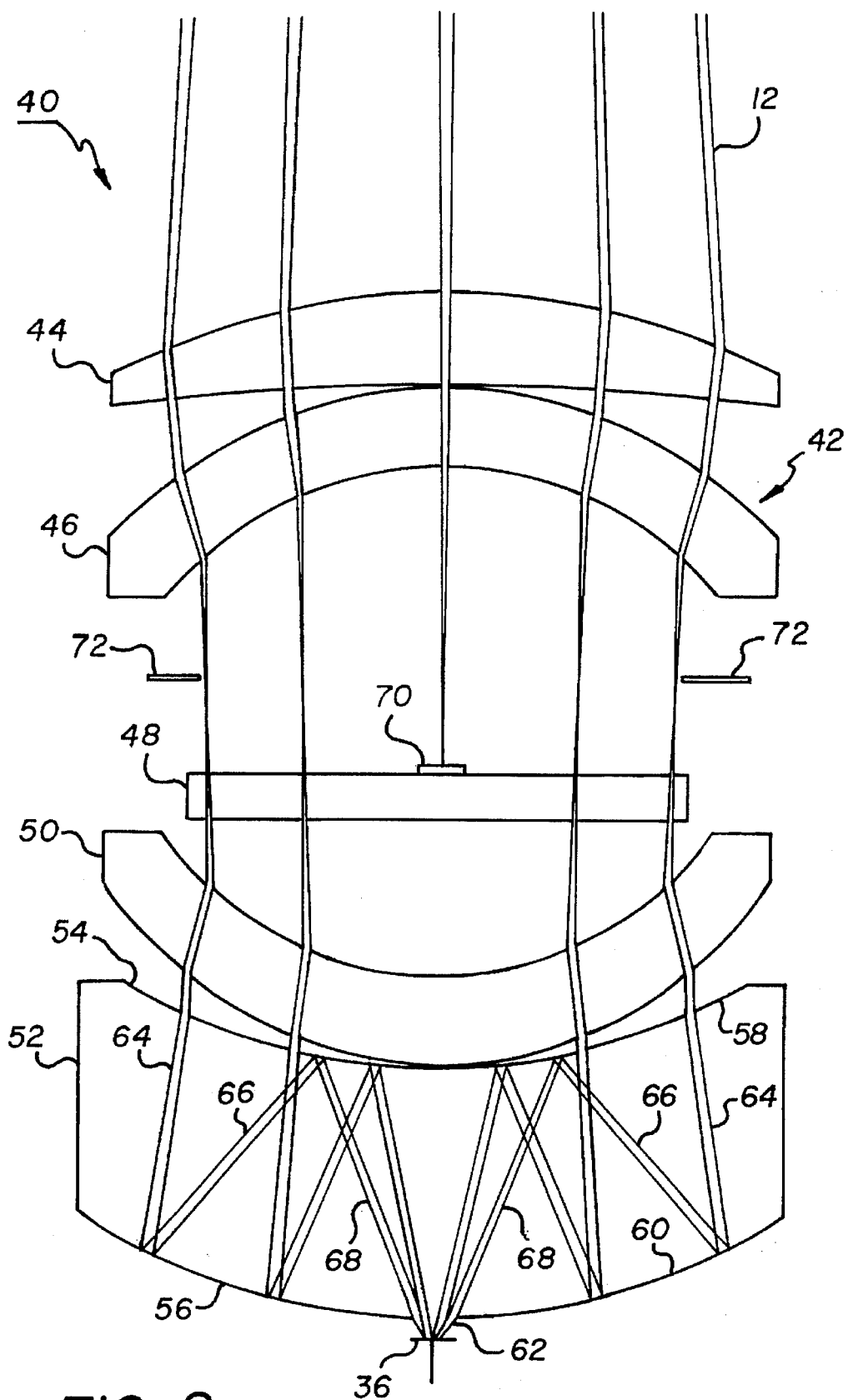
FIG. 2 is an enlarged diagram of our new catadioptric reducing system for completing the projection of an illuminated mask on a substrate.

Our catadioptric reducing system 40, shown in more detail by FIG. 2, projects a greatly reduced image of the illuminated reticle 34 onto a surface of the substrate 36. The reticle 34 and the substrate 36 are oriented parallel to each other and are aligned together with our catadioptric reducing system 40 along the optical axis 28.

A lens group 42, comprising transmissive optical elements 44, 46, 48, and 50, conditions the beam 12 for entry into reducing optic 52 having a concave front face 54 and a convex back face 56. The concave front face 54 of the reducing optic 52 is coated to form a partially reflective surface 58 that provides partial transmission uniformly throughout its aperture. The convex back face 56 is coated in an annular pattern to form a concave reflective surface 60 surrounding a central aperture 62.

A portion 64 of the beam 12 is transmitted through the partially reflective surface 58 to the concave reflective surface 60, which returns a converging beam 66. A portion 68 of the returning beam 66 is reflected by the partially reflective surface 58 on a converging path through the central aperture 62 to a point of focus on the substrate 36. The reducing optic 52 focuses a reduced image of the reticle 34 on the substrate 36.

The lens groups 30 and 42, along with the reducing optic 52, are preferably made of fused silica for transmitting the beam 12 of deep ultraviolet light. However, fluorite could also be used. The total refractive power of the lens group 42 and reducing optic 52 of our catadioptric reducing system 40 is minimized to avoid chromatic aberrations caused by refracting the different wavelengths of the output band of the laser light source 10. The reflective surface 60, along with the partially reflective surface 58, provides the reducing power; and the lens group 42, along with the refractive interactions of the reducing optic 52, provides correction for the systematic aberrations of the reflecting surfaces.

One of the members of the lens group 42 is the substantially plane parallel plate 48 having a front face 66 and a back face 68. The front face 66 is planar, but the back face 68 is modified to include an aspheric surface that corrects for spherical aberrations. The back face 56 of the reducing optic 52 is also modified to include an aspheric surface to correct spherical aberrations at an even faster rate.

A central obscuration 70, such as a reflective coating, is applied to the front face 66 of the plate 48 to block portions of the beam 12 that would otherwise pass directly through the central aperture 62 without first reflecting from the reflecting surface 60 of the reducing optic 52. The plate 48 containing the central obscuration 70 is positioned close to an aperture stop 72 at which an image of the adjustable aperture 38 is formed. The central obscuration 70 is relatively small and blocks only about 10 percent of the diameter of the surrounding aperture, whose outer diameter is controlled by the aperture stop 72. This converts to only 1 percent of the aperture area. Preferably, the central obscuration is limited to no more than 15 percent of the aperture diameter or a little more than 2 percent of the aperture area to minimize undesirable diffractive effects that reduce contrast of the reticle pattern on the substrate 36.

Tables 1 and 2 provide prescription information on the preferred embodiment. All distances are measured in millimeters (mm), curvature is measured as a radius, but aperture is measured as a diameter. The central aperture 62 has a diameter of 6 mm. The reduction magnification is 10 fold and the numerical aperture is 0.6. With a constant "$K_1$" assumed at 0.5, the minimum feature size that can be imaged on the substrate is reduced to 0.16 microns. Features less than 0.20 microns would be possible under less stringent conditions (e.g., with a constant "$K_1$" at 0.6).

TABLE 1

| Element | Curvature | | Aperture | | |
|---|---|---|---|---|---|
| Number | Front | Back | Front | Back | Thickness |
| Object space | | | | | 492.0402 |
| 44 | 77.9574 | 297.6566 | 61.4083 | 60.1506 | 9.7738 |
| space | | | | | 0.4000 |
| 46 | 49.2496 | 38.8156 | 57.8441 | 52.0798 | 8.0000 |
| space | | | | | 22.8357 |
| 72 | | | 50.5998 | | |
| space | | | | | 10.0000 |
| 48 | plane | A(1) | 50.4728 | 50.4321 | 5.0000 |
| space | | | | | 16.1580 |
| 50 | −37.1784 | −43.9590 | 50.3358 | 55.6548 | 9.0000 |

TABLE 1-continued

| Element | Curvature | | Aperture | | |
|---|---|---|---|---|---|
| Number | Front | Back | Front | Back | Thickness |
| space | | | | | 0.50000 |
| 52 | −70.5974 | A(2) | 56.0455 | 64.5635 | 25.7923 |
| space Image | | | | | 2.5000 |

An equation defining the aspheric surfaces "A(1)" and "A(2)" of the plate 48 and reduction optic 52 is given below:

$$Z = \frac{(CURV)Y^2}{1 + (1 - (1+K)(CURV)^2 Y^2)^{1/2}} + (A)Y^4 + (B)Y^6 + (C)Y^8 + (D)Y^{10}$$

The coefficient "K" is equal to zero. The coefficient "CURV" and the coefficients "A" through "D" are given in Table 2.

TABLE 2

| | CURV | A | B | C | D |
|---|---|---|---|---|---|
| A(1) | −1.5899E-04 | 2.4964E-07 | −1.5511E-10 | 5.5612E-14 | −1.8490E-16 |
| A(2) | −1.4052E-02 | −6.4218E-10 | −8.7217E-13 | −8.7864E-16 | 7.1696E-19 |

Of course, our invention can be practiced with a variety of other prescriptions operating at other reduction powers and sizes of scale. Numerical apertures of at least 0.4 are preferred. A single aspherical corrective surface could be formed on one of the elements including either the back face 68 of the plate 48 or the back face 56 of the reducing optic 52. Although it is important to limit the amount of optical material required to transmit the deep ultraviolet light, more corrective elements could be used with a larger aperture design to provide a larger area of illumination.

We claim:

1. A catadioptric reduction system for deep ultraviolet lithography comprising:
   a reducing optic having a main body made of a transmissive material that conducts a beam of deep ultraviolet light;
   a back face of said reducing optic having a central aperture surrounded by a concave reflective surface;
   a front face of said reducing optic having a partially reflective surface that transmits a portion of the beam to said concave reflecting surface and reflects a portion of the remaining beam returned by said concave reflective surface on a path through said central aperture;
   a lens group also made from a transmissive material that conducts the beam of ultraviolet light for correcting aberrations generated by said reducing optic; and
   a central obscuration blocking a portion of the beam that is not reflected by said concave reflective surface from passing through said aperture.

2. The reduction system of claim 1 in which said reflective and partially reflective surfaces of said reducing optic provide substantially all reducing power of the system for limiting chromatic aberrations accompanying transmission of a range of wavelengths.

3. The reduction system of claim 2 in which said reflective and partially reflective surfaces provide a 10-fold reduction.

4. The reduction system of claim 1 in which said reducing optic and said lens group are aligned with a common optical axis.

5. The reduction system of claim 1 further comprising a substantially plane parallel plate that is modified to include an aspheric surface to correct for aberrations generated by said reflective and partially reflective surfaces.

6. The reduction system of claim 1 in which said concave reflective surface is modified to include an aspheric surface to correct for aberrations generated by said reflective and partially reflective surfaces.

7. The reduction system of claim 5 in which said central obscuration is formed as a stop on said plane parallel plate.

8. The reduction system of claim 7 in which said central obscuration blocks no more than 15 percent of a diameter of the beam incident upon said plate.

9. The reduction system of claim 8 in which said central obscuration blocks no more than 10 percent of the beam diameter.

10. An optical projection system for projecting a reduced image of a first surface onto a second surface comprising:

a lens group that receives a beam of light passing through the first surface;

a partially reflective surface for transmitting a portion of the beam;

a concave reflective surface surrounding a central aperture for reflecting a portion of the transmitted beam;

a central obscuration for blocking another portion of the beam of light from transmitting between said partially reflective surface and said central aperture; and said partially reflective surface being related to said central aperture and said concave reflective surface for further reflecting a portion of the reflected beam from said reflective surface on a path through said central aperture forming a reduced image of the first surface on the second surface.

11. The projection system of claim 10 in which the first and second surfaces are parallel to each other and aligned with a common optical axis.

12. The projection system of claim 11 in which said lens group, said partially reflective surface, said concave reflective surface, and said central obscuration are aligned with said common optical axis.

13. The projection system of claim 12 in which said partially reflective surface covers a front face of a transmissive optic.

14. The projection system of claim 13 in which said front face of the transmissive optic is a concave surface.

15. The projection system of claim 14 in which said concave reflective surface surrounds said central aperture on a back face of said transmissive optic.

16. The projection system of claim 15 in which said back face of the transmissive optic is a convex surface.

17. The projection system of claim 10 further comprising a substantially plane parallel plate that is modified to include an aspheric surface to correct for aberrations generated by said reflective and partially reflective surfaces.

18. The projection system of claim 17 in which said concave reflective surface is also modified to include an aspheric surface to correct for aberrations generated by said reflective and partially reflective surfaces.

19. The projection system of claim 10 in which said central obscuration is surrounded by a given diameter aperture of the beam, and said central obscuration blocks no more than 15 percent of the beam diameter.

20. The projection system of claim 19 in which said central obscuration is formed as a stop on a plane parallel plate that is modified to include an aspheric surface to correct for aberrations generated by said reflective and partially reflective surfaces.

21. The projection system of claim 19 in which said central obscuration blocks no more than 10 percent of the beam diameter.

22. A method of projecting a reduced image of a mask on a substrate having a feature size less than 0.2 microns with a beam of deep ultraviolet light having a wavelength less than 200 NM comprising the steps of:

emitting a beam of light having a band of wavelengths less than 200 NM;

illuminating the mask with the beam;

conditioning the beam with a lens group;

transmitting a portion of the beam through a partially reflective surface;

reflecting a portion of the transmitted beam with a concave reflective surface surrounding a central aperture; and further reflecting a portion of the reflected beam with the partially reflective surface on a path through the central aperture forming a reduced image of the mask on the substrate having a feature size less than 0.2 microns.

23. The method of claim 22 including the further step of orienting the reticle and the substrate parallel to each other and aligned with a common optical axis.

24. The method of claim 23 including the further step of aligning the lens group, partially reflective surface, and reflective surface with the common optical axis.

25. The method of claim 22 including the further step of blocking a portion of the beam that is not reflected by the concave reflective surface from transmitting between the partially reflective surface and said central aperture.

26. The method of claim 25 in which the beam has a given aperture diameter within the lens group and said step of blocking blocks no more than 15 percent of the beam diameter.

27. The method of claim 26 in which said step of blocking blocks no more than 10 percent of the beam diameter.

28. The method of claim 22 including the further step of adding a plane parallel plate to the lens group for correcting aberrations generated by the reflective and partially reflective surfaces.

29. The method of claim 28 including positioning a central obscuration on the plane parallel plate for blocking a portion of the beam that is not reflected by the concave reflective surface from transmitting between the partially reflective surface and said central aperture.

30. The method of claim 22 including the step of forming the concave reflective surface as an aspheric surface for correcting aberrations generated by the reflective and partially reflective surfaces.

* * * * *

UNITED STATES PATENT AND TRADEMARK OFFICE
CERTIFICATE OF CORRECTION

PATENT NO. : 5,650,877
DATED : Jul. 22, 1997
INVENTOR(S) : Anthony R. Phillips, Jr. and Paul F. Michaloski It is certified that error appears in the above-identified patent and that said Letters Patent is hereby corrected as shown below:

Column 3, lines 28-29, delete "projected image. The central obscuration can be conveniently" and at line 31, after "of the" insert --projected image. The central obscuration can be conveniently--.

Signed and Sealed this

Ninth Day of December, 1997

*Attest:*

BRUCE LEHMAN

*Attesting Officer*  Commissioner of Patents and Trademarks